United States Patent
Ghannam et al.

(10) Patent No.: US 9,868,408 B2
(45) Date of Patent: Jan. 16, 2018

(54) PROTECTIVE COVER FOR VEHICULAR CONTROL MODULE

(71) Applicant: Ford Global Technologies, LLC, Dearborn, MI (US)

(72) Inventors: Mahmoud Yousef Ghannam, Canton, MI (US); Jayagopal Appukutty, Troy, MI (US); Jeffery Hammoud, Dearborn Heights, MI (US); Swadad A. Carremm, Canton, MI (US)

(73) Assignee: Ford Global Technologies, LLC, Deaborn, MI (US)

( * ) Notice: Subject to any disclaimer, the term of this patent is extended or adjusted under 35 U.S.C. 154(b) by 0 days.

(21) Appl. No.: 15/010,742

(22) Filed: Jan. 29, 2016

(65) Prior Publication Data

US 2017/0217388 A1 Aug. 3, 2017

(51) Int. Cl.
*B60R 16/023* (2006.01)
*H05K 5/02* (2006.01)
(Continued)

(52) U.S. Cl.
CPC ....... *B60R 16/0239* (2013.01); *H05K 5/0221* (2013.01); *H05K 5/03* (2013.01); *H05K 5/061* (2013.01)

(58) Field of Classification Search
CPC .... B60R 16/0239; H05K 5/03; H05K 5/0221; H05K 5/061
See application file for complete search history.

(56) References Cited

U.S. PATENT DOCUMENTS 6,347,819 B1 2/2002 Plaxco
8,704,109 B2 * 4/2014 Demma .............. B60R 16/0239
174/541

(Continued)

FOREIGN PATENT DOCUMENTS

CN 204968263 U 1/2016
CN 205584675 U 9/2016
(Continued)

OTHER PUBLICATIONS

OEM 03-06 Lincoln Navigator Xenon Ballast & Cover Lid HID Control Unit Module [online], Factory Xenon, reteived on Jan. 28, 2016 from http://factoryxenon.com/shop/oem-03-06-lincoln-navigator-xenon-ballast-cover-lid-hid-control-unit-module-2/.

(Continued)

*Primary Examiner* — D Glenn Dayoan
*Assistant Examiner* — Melissa A Black
(74) *Attorney, Agent, or Firm* — James P. Muraff; Neal, Gerber & Eisenberg LLP

(57) ABSTRACT

Embodiments include a protective cover for a control module mounted to a vehicle surface using attachment mechanisms that extend perpendicularly from the vehicle surface. The protective cover comprises a rigid top portion having a top surface and four sidewalls configured to cover the control module and engage the vehicle surface. The protective cover also comprises a plurality of insets molded into at least two of the sidewalls, each inset configured to receive a respective attachment mechanism. Embodiments also include an apparatus for protecting a control module mounted to a vehicular surface using a plurality of attachment mechanisms. The apparatus comprises a rigid top structure configured to completely cover the control module and a flexible gasket coupled to a bottom edge of the top structure and configured to removably engage the vehicular surface surrounding the control module in a fluid-tight seal.

16 Claims, 5 Drawing Sheets

(51) Int. Cl.
  *H05K 5/06* (2006.01)
  *H05K 5/03* (2006.01)

(56) References Cited

U.S. PATENT DOCUMENTS

| | | |
|---|---|---|
| 8,982,541 B1 | 3/2015 | Roberts et al. |
| 2006/0098417 A1 | 5/2006 | Yuan et al. |
| 2013/0265208 A1 | 10/2013 | Sawaya |
| 2014/0239904 A1* | 8/2014 | Tanaka .................... B60R 16/04 |
| | | 320/128 |
| 2015/0137589 A1* | 5/2015 | Iyatani .................... B60T 8/368 |
| | | 303/20 |

FOREIGN PATENT DOCUMENTS

| | | |
|---|---|---|
| DE | 102013226930 A1 | 6/2015 |
| GB | 1514742 A | 5/1975 |
| GB | 2529066 A | 10/2016 |
| JP | H0227796 A | 1/1990 |
| JP | 2008182663 A | 8/2008 |
| WO | WO 2015199177 A1 | 12/2015 |

OTHER PUBLICATIONS

Search Report dated Jun. 13, 2017 for GB Patent Application No. GB1701411 9.

* cited by examiner

US 9,868,408 B2

PROTECTIVE COVER FOR VEHICULAR CONTROL MODULE

TECHNICAL FIELD

This application generally relates to protective covers for electronics and more specifically, to protective covers for vehicular control modules.

BACKGROUND

Commercially-available vehicles comprise a number of electronic modules or control units for controlling various aspects of vehicle operation, including critical functions, such as, for example, restraint control and power management. When subject to exposed conditions, these electronics modules may be susceptible to damage affecting the main functionality of the module. For example, the electronics and connectors of an exposed electronic module may be damaged by accidental exposure to environmental elements (e.g., water, dirt, etc.) or impact conditions (e.g., collisions, drops, jostling, and other forces).

In general, electronic modules may be subject to exposed conditions during various stages of the vehicle manufacturing process, including prior to installation into the vehicle, for example, during shipment from a device manufacturer to a supplier and/or the vehicle manufacturer, and during device installation, for example, within a vehicle manufacturing facility. Some electronic modules are also subject to exposed conditions after installation in the vehicle chassis or frame. For example, certain specialty vehicles (e.g., commercial vehicles, police vehicles, etc.) are partially assembled with one or more control modules at a first manufacturing facility and then shipped to a second manufacturing facility to modify or customized specific components and complete assembly of the vehicle.

In some cases, certain electronic modules remain exposed, or more susceptible to damage, even after the vehicle is completely assembled. For example, the restraint control module (RCM) is typically mounted to the vehicle chassis in the space between the front driver's seat and the front passenger seat. Many vehicles also include a center console between the two front seats, which helps cover and protect the electronics beneath it from exposure to potentially damaging conditions. However, in some vehicles (e.g., commercial trucks, two-passenger vehicles, etc.), the center console is removed or excluded, thus eliminating a layer of protection for the RCM and any electronics adjacent thereto Many electronic modules include some minimal level of protection, such as, for example, an outer cover to make device handling easier and to protect the internal electronics from incidental impacts, and/or a sealant applied to the surface of the module to protect against a light spray or minor moisture build-up. However, such covers are not capable of protecting the electronic module from, or resisting, extreme exposure conditions, such as, for example, water seepage or a major impact.

Moreover, while protection of vehicle electronics may be desirable at all stages of installation or assembly, accessibility is another important concern. For example, technicians and/or assembly line workers may need easy access to the electronic components of a module for various reasons (e.g., repair, replacement, programming, troubleshooting, etc.) and at various points in time (e.g., before, during, or after vehicle assembly). As a result, electronic modules cannot be permanently encased in a protective enclosure, even though it may help limit exposure.

Accordingly, there is a need in the art for an apparatus that can reliably protect vehicular control modules from extreme exposed conditions at all stages of assembly and installation, but also provide access to the electronic components within the module.

SUMMARY

The invention is intended to solve the above-noted and other problems by providing a protective cover for a restraint control module and other electronic modules coupled to a vehicle surface, wherein the protective cover (1) is removably secured to the electronic module and the surrounding vehicle surface, (2) comprises a rigid outer shell capable of resisting impacts from hard objects, (3) comprises a flexible base configured to create a fluid-tight seal on the vehicle surface, and/or (4) can be configured for use with different types of control modules.

One example embodiment provides a protective cover for a control module mounted to a vehicle surface using attachment mechanisms that extend perpendicularly from the vehicle surface. The protective cover comprises a rigid top portion having a top surface and four sidewalls configured to cover the control module and engage the vehicle surface. The protective cover also comprises a plurality of insets molded into at least two of the sidewalls, each inset configured to receive a respective attachment mechanism.

Another example embodiment provides an apparatus for protecting a control module mounted to a vehicular surface using a plurality of attachment mechanisms. The apparatus comprises a rigid top structure configured to completely cover the control module. The apparatus also comprises a flexible gasket coupled to a bottom edge of the top structure and configured to removably engage the vehicular surface surrounding the control module in a fluid-tight seal.

As will be appreciated, this application is defined by the appended claims. The description summarizes aspects of the embodiments and should not be used to limit the claims. Other implementations are contemplated in accordance with the techniques described herein, as will be apparent to one having ordinary skill in the art upon examination of the following drawings and detail description, and such implementations are intended to within the scope of this application.

BRIEF DESCRIPTION OF THE DRAWINGS

For a better understanding of the invention, reference may be made to embodiments shown in the following drawings. The components in the drawings are not necessarily to scale and related elements may be omitted so as to emphasize and clearly illustrate the novel features described herein. In addition, system components can be variously arranged, as known in the art. Further, in the drawings, like reference numerals designate corresponding parts throughout the several views.

DETAILED DESCRIPTION OF EXAMPLE EMBODIMENTS

Figure 1:
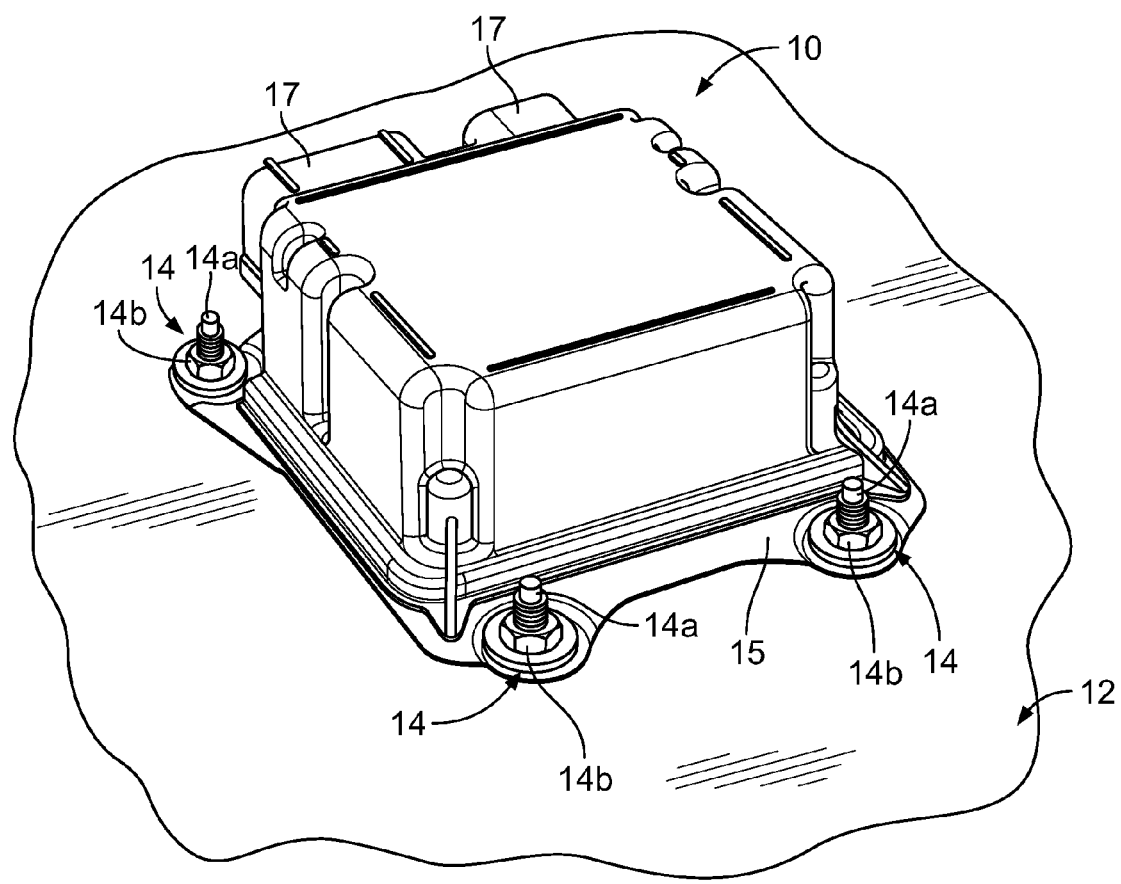
FIG. 1 depicts a conventional electronic control module coupled to a vehicle surface.

While the invention may be embodied in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated.

In this application, the use of the disjunctive is intended to include the conjunctive. The use of definite or indefinite articles is not intended to indicate cardinality. In particular, a reference to "the" object or "a" and "an" object is intended to denote also one of a possible plurality of such objects.

FIG. 1 illustrates a conventional electronic control module 10 (also referred to herein as an "electronic module" or a "control module") coupled to a surface 12 of a vehicle (not shown), in accordance with embodiments. The vehicle surface 12 can be any surface of the vehicle 10 that is configured to be coupled to an electronic control module 10, such as, for example, a printed circuit board (PCB) or a floor surface of the vehicle. The electronic module 10 can be any type of electronic control unit (ECU) for controlling one or more features or components of the vehicle, such as, for example, a restraint control module (RCM) for controlling and monitoring a restraint system of the vehicle, a telematics control unit (TCU) for enabling the vehicle to connect to one or more wireless networks, an extended power module (EPM) for controlling power management and distribution, or a body control module (BCM) for controlling and monitoring various electronic accessories in the vehicle body. In a preferred embodiment, the electronic module 10 is a restraint control module or any other control module positioned on the vehicle surface 12 between a front driver seat (not shown) and a front passenger seat (not shown) of the vehicle.

As shown in FIG. 1, the electronic module 10 is secured to the vehicle surface 12 at three attachment points using a plurality of attachment mechanisms 14. Each attachment mechanism 14 can include a bolt, screw, or pin 14a that is coupled at one end (not shown) to the vehicle surface 12 and perpendicularly extends from the surface 12, as shown. A base 15 of the electronic module 10 can include a plurality of openings or screw holes (such as, e.g., openings 16 shown in FIG. 9) for receiving respective pins 14a. As will be appreciated, the placement of the pins 14a on the vehicle surface 12 may be configured based on the configuration of the base 15 and the openings therein. Each attachment mechanism 14 can further include a nut or other fastener 14b for securing the openings of base 15 to the pins 14a.

Figure 2:
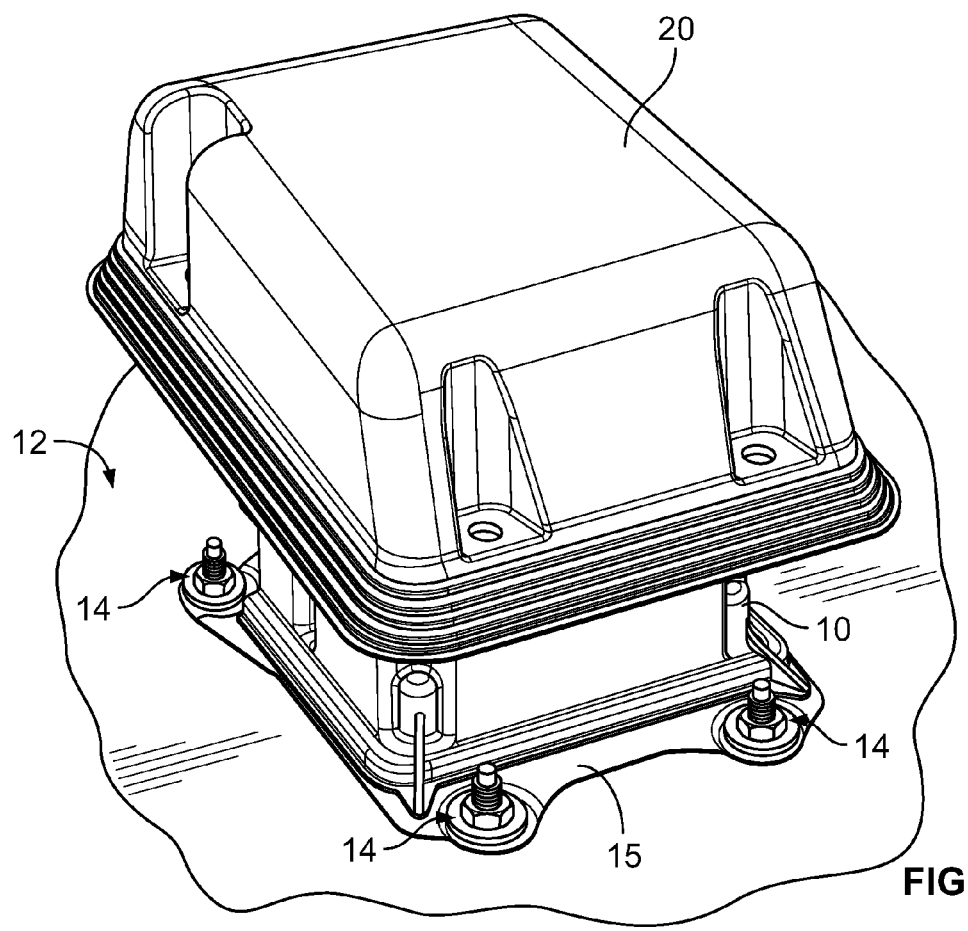
FIG. 2 depicts a front perspective view of an exemplary protective cover for removably shielding an electronic control module, according to embodiments.

FIGS. 2-9 depict an exemplary protective cover 20 configured to protect the electronic module 10 from hard impacts, fluid spills, and other types of potentially damaging exposures, in accordance with embodiments. As shown in FIG. 2, the protective cover 20 can be configured for placement over the electronic module 10, for example, once the module 10 has been mounted to the vehicle surface 12. This allows installment of the module 10 to be completed before the protective cover 20 is secured. Further, the protective cover 20 can be removably attached to the electronic module 10 to ensure continuing access to the module 10 after installation of the cover 20.

Figure 3:
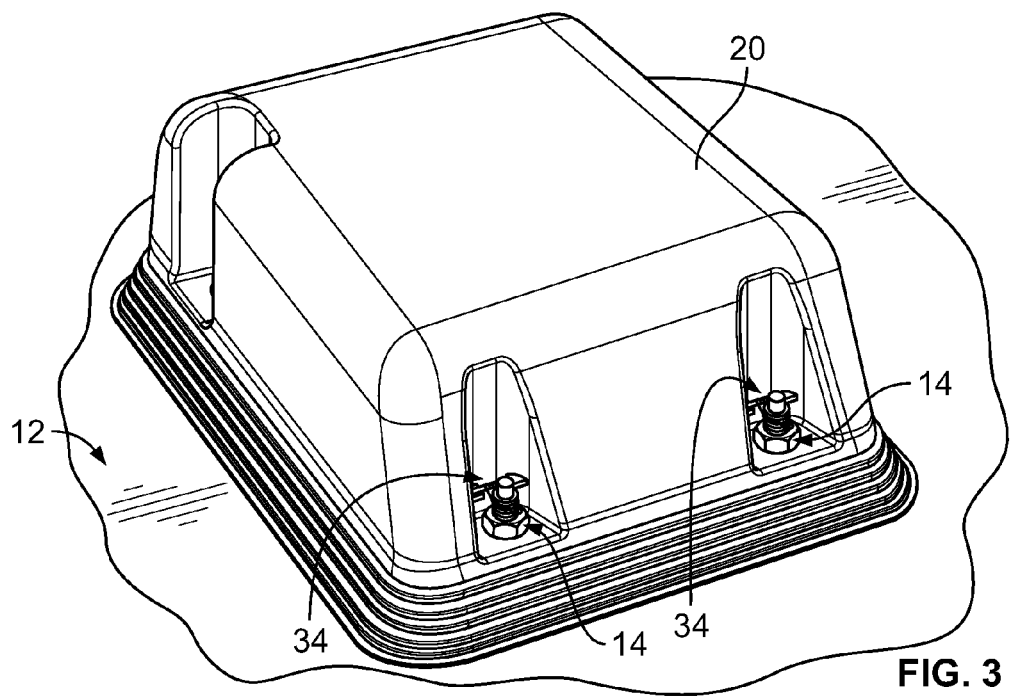
FIG. 3 depicts a front perspective view of the protective cover of FIG. 2 coupled to the electronic control module and the vehicle surface shown in FIG. 1, according to embodiments.

As shown in FIG. 3, the dimensions and overall shape of the protective cover 20 can be selected such that the electronic module 10 is completely covered from a top side to the base 15 and on all four sides and engages the vehicular surface 12 surrounding the module 10. For example, the protective cover 20 can have a generally rectangular shape to match the generally rectangular shape of the electronic module 10. Further, a height of the protective cover 20 can be selected so that there is sufficient clearance between the top of the module 10 and the top of the cover 20 after placing the cover 20 on the vehicle surface 12. In some embodiments, a height, width, and depth of the protective cover 20 can be selected such that the cover 20 is suitable for any type of electronic module 10 to provide a "one size fits all" feature. For example, in some vehicles, the variation in height between various electronic modules is only 10 millimeters, and so, a height of the protective cover 20 can be selected based on the tallest module. In other cases, the dimensions and overall shape of the protective cover 20 can be configured for a particular module by, for example, making specific adjustments to the tooling used to manufacture the cover 20.

Figure 4:
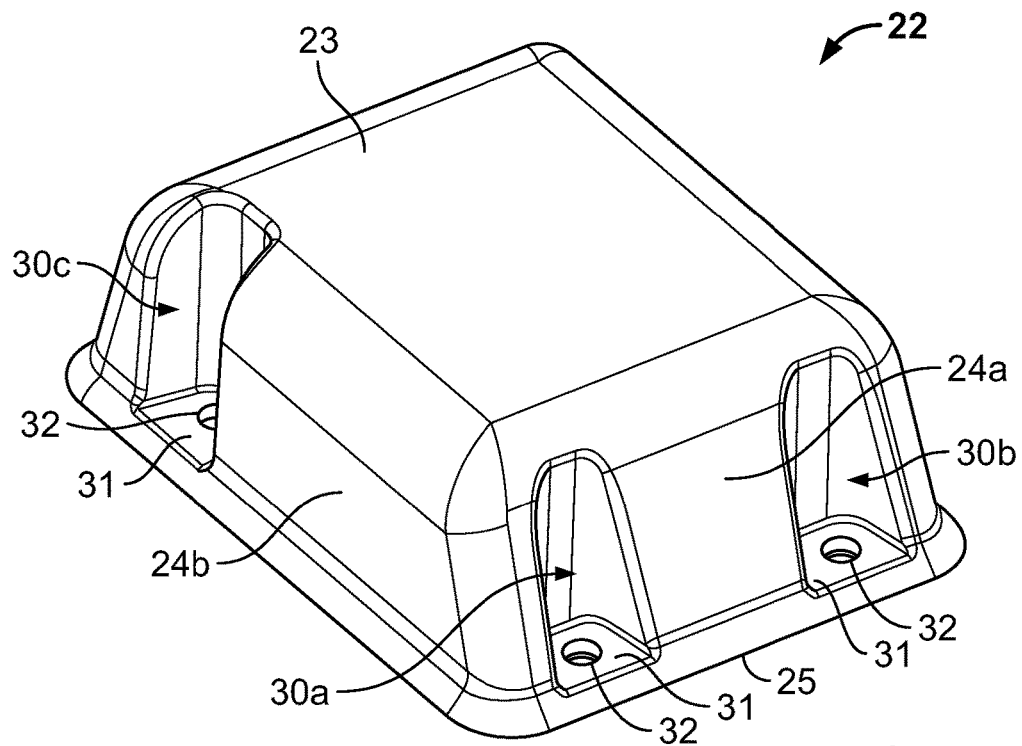
FIG. 4 depicts a front perspective view of the protective cover shown in FIG. 2 without a base portion, according to embodiments.

As shown in FIG. 4, the protective cover 20 includes a rigid top structure 22 (also referred to herein as a "top portion") with a top surface 23 supported by four sidewalls 24 that extend from the top surface 23 down towards a bottom edge 25 of the top structure 22. The top structure 22 can include one or more reinforcing features designed to enable the top structure 22 to absorb hard impacts and/or resist indentation or collapse, thereby protecting the electronic module 10 therein. In particular, the top structure 22 can be comprised of any hard, sturdy material, such as, for example, plastic, fiberglass, steel, or other metals. Also, a thickness of the material may be selected to further enhance the structural strengthen of the cover 20. In addition, the corners and edges of the top surface 23 and the sidewalls 24 can be curved or contoured so as to eliminate sharp corners or other weak points that may be prone to breakage during an impact.

Figure 5:
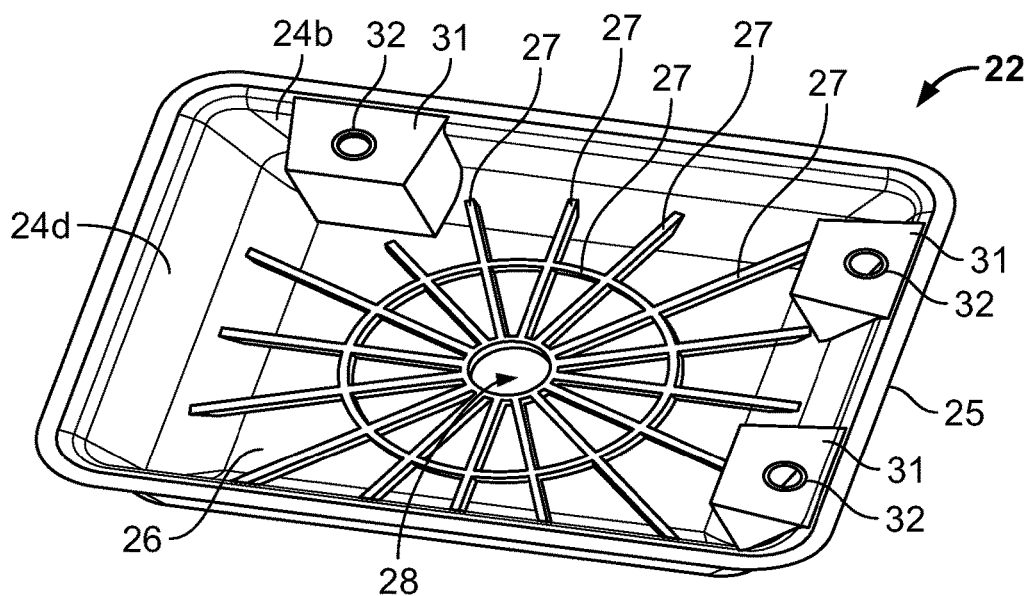
FIG. 5 depicts a bottom perspective view of the protective cover shown in FIG. 4, according to embodiments.

Also, as shown in FIG. 5, an inner surface or underside 26 of the top structure 22 can include a plurality of ribs 27 for reinforcing the top surface 23, the inner surface 26 being opposite or underneath the top surface 23. In embodiments, the ribs 27 can be arranged in a predefined pattern designed to add structural strength to the top surface 23 and/or the top structure 22 as a whole. For example, as shown in FIG. 5, the ribs 27 can be arranged in a geometrical pattern that radially extends out from a center 28 of the inner surface 26. As also shown in FIG. 5, the ribs 27 may be concentrated at the center 28 of the inner surface 26 in order to further prevent buckling at, and/or reinforce, a center of the top structure 22.

In addition to protecting against impacts, the solid top structure 22 of the cover 20 can help preserve signal quality and provide noise and vibration damping for the electronic module 10 therein. Further, the solid surface of the top structure 22 can provide a shield against environmental elements, such as, for example, fluids, dirt, and other contaminates. For example, as shown in FIG. 4, the bottom edge 25 of the top structure 22 can include a side lip or contour that slopes away from the sidewalls 24 to prevent liquid from seeping in under the cover 20.

Figure 6:
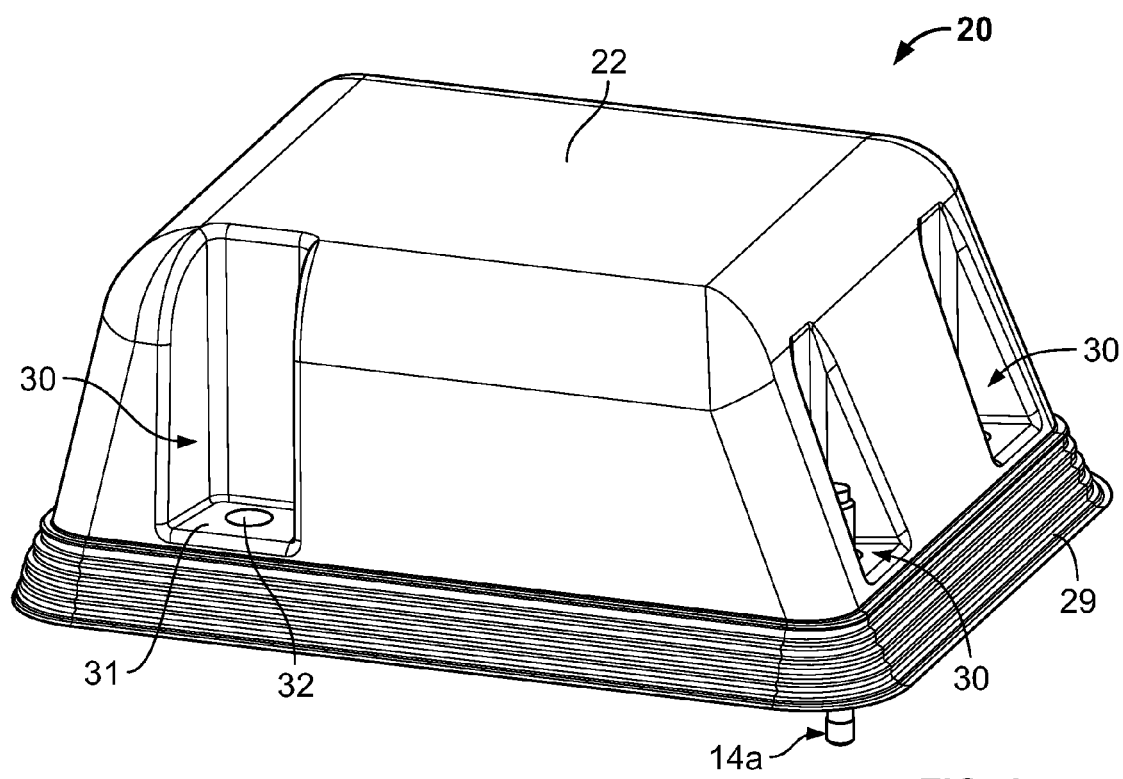
FIG. 6 depicts a side perspective view of the protective cover shown in FIG. 2, according to embodiments.

As shown in FIG. 6, to further prevent seepage, the protective cover 20 can include a flexible and compressible base portion 29 (also referred to herein as a "gasket") coupled to the bottom edge 25 of the top structure 22. In embodiments, the base portion 29 can be configured to form a fluid-tight seal between the vehicle surface 12 surrounding the module 10 and the protective cover 20. For example, the base portion 29 can be made of a flexible or deformable material (such as, e.g., rubber) that forms a suction-like hold when compressed onto the vehicle surface 12. This gasket-like feature of the base portion 29 also enables the protective cover 20 to be easily removed from the vehicle surface 12, without causing damage or requiring additional tools. For example, the cover 20 may be removed by pulling on, or lifting, the top structure 22 off of the vehicle surface 12 to disengage the suction-like hold.

Figure 7:
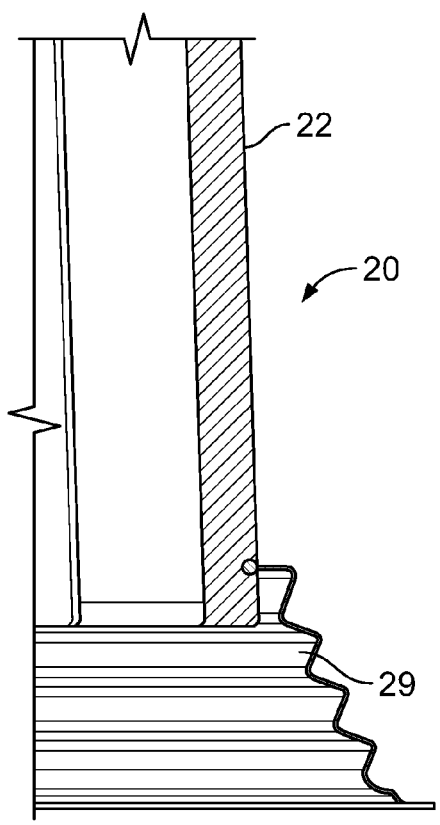
FIG. 7 depicts a partial cross-sectional view of a base portion of the protective cover shown in FIG. 6, according to embodiments.

As shown in FIGS. 6 and 7, the base portion 29 can have a corrugated or accordion-like structure that at least partially compresses when the top structure 22 is pushed down on top of the electronic module 10 and against the vehicle surface 12 surrounding the module 10, during installation of the cover 20. For example, in some embodiments, the base portion 29 compresses down by approximately four millimeters (mm) when installed on the surface 12 in a compressed or engaged state. Likewise, when the base portion 29 is released from the surface 12, the corrugated structure may at least partially expand or decompress to return to an uncompressed or relaxed state. Thus, due to its corrugated structure, the base portion 29 can be configured to operate like a spring that forms a seal when compressed and unseals when released. As will be appreciated, other techniques may be used, in addition to, or instead of, the corrugated based portion 29 to form the fluid-tight seal between the base portion 29 and the vehicle surface 12, such as, for example, an adhesive coating applied to a bottom of the base portion 29 and/or the bottom edge 25 of the top portion 22.

Referring back to FIGS. 4 and 6, the top structure 22 further includes a plurality of notches or insets 30 that are configured to provide attachment points for securing the protective cover 20 to the electronic module 10. As shown, the notches 30 can be molded into or formed within respective sidewalls 24, so as to form a recess comprising three sidewalls terminating at a flat planar portion 31 (also referred to herein as a "seat portion") adjacent to the bottom edge 25. The flat portion 31 comprises a hole or aperture 32 configured to receive a respective one of the attachment mechanisms 14 for attaching the electronic module 10 to the vehicle surface 12, as shown in FIG. 3. In embodiments, the notches 30 can provide additional strengthening support to the top structure 22, to supplement the ribs 27 and other strengthening features of the top structure 22. For example, as shown in FIG. 5, the flat portion 31 can help further reinforce the sidewalls 24 of the top structure 22 near the bottom edge 25.

Figures 8A, 8B:
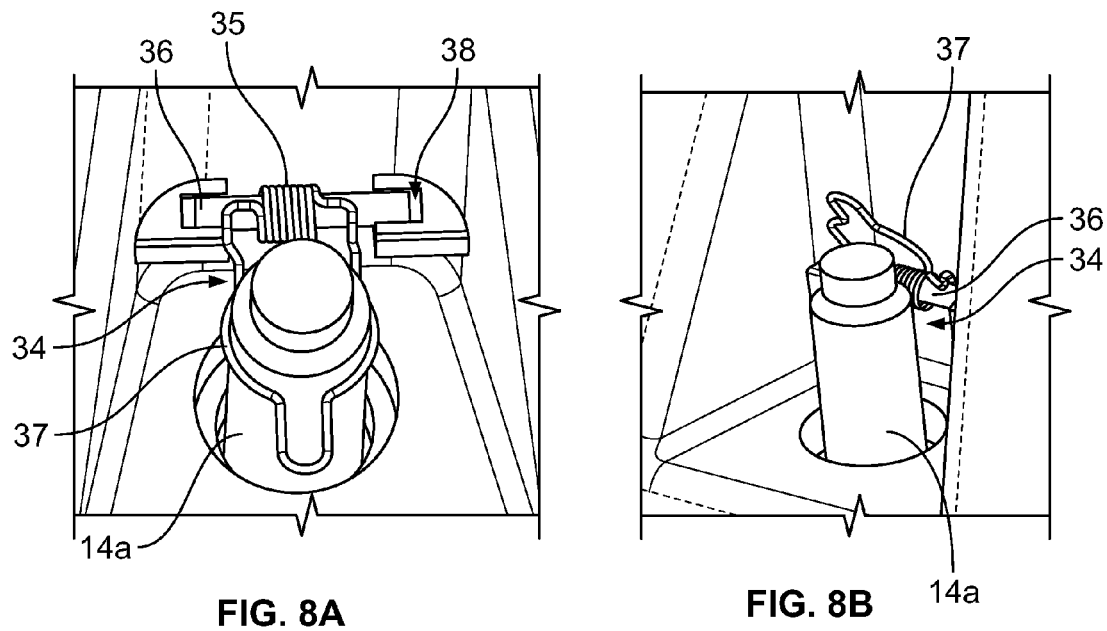
FIGS. 8A and 8B depict locked and unlocked positions of an exemplary locking mechanism included in the protective cover shown in FIG. 2, according to embodiments.

In some embodiments, the apertures 32 can be sized and shaped to receive only the pins 14a of the attachment mechanisms 14, as shown in FIGS. 8A and 8B. In other embodiments, the apertures 32 can be sized and shaped to receive the fasteners 14b as well as the pins 14a, as shown in FIG. 3. In either case, the notches 30 are configured to utilize the existing attachment structures 14 on the vehicle surface 12 to securely attach the protective cover 20 to the vehicle surface 12 surrounding the electronic module 10. In this manner, the protective cover 20 can have a reduced footprint on the vehicle surface 12, thereby leaving adjacent surface space free for other uses.

Figure 9:
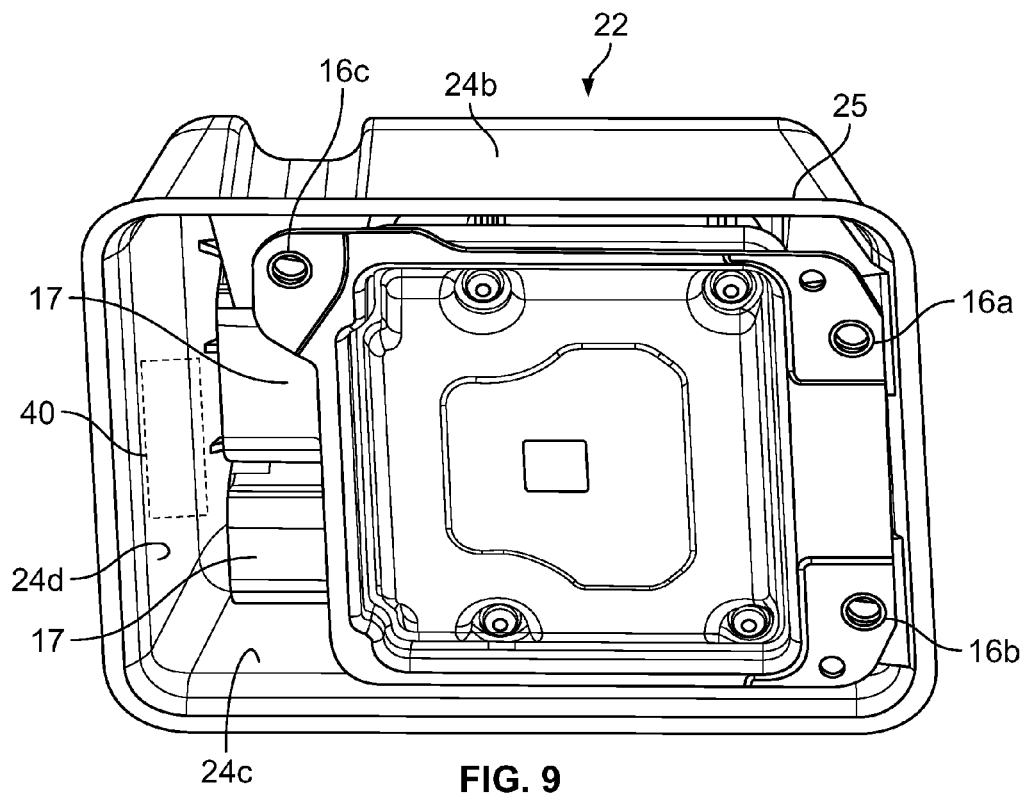
FIG. 9 depicts a bottom perspective view of an electronic control module installed within the protective cover shown in FIG. 4, according to embodiments.

In embodiments, an arrangement of the notches 30 within the sidewalls 24 of the top structure 22 can be selected based on a configuration of the attachment mechanisms 14 on the vehicle surface 12 and/or the openings 16 in the base 15 of the electronic module 10. For example, as shown in FIG. 9, in the illustrated module 10, two of the openings 16a and 16b are positioned on a front side of the electronic module 10 and a third opening 16c is positioned on a left side of the module 10. Accordingly, as shown in FIG. 4, two of the notches 30a and 30b are included in a front sidewall 24a and a third notch 30c is included in a left sidewall 24b. In some modules (not shown), the third opening 16c may be positioned on, for example, a right side of the module 10. In such cases, the third notch 30c may be included on a right sidewall 24c (not shown) to accommodate the module configuration. Likewise, the protective cover 20 may include additional or fewer notches 30 depending on the number of openings 16 and/or attachment mechanisms 14.

Referring now to FIGS. 8A and 8B, shown is an example locking mechanism 34 that may be coupled within each of the notches 30 to releasably secure the attachment mechanisms 14 of the electronic module 10 to the protective cover 20. In the illustrated embodiment, the locking mechanism 34 is a built-in spring lock (or a self-spring lock) that can be pressed down into a locked position to secure the locking mechanism 34, as shown in FIG. 8A, and pushed or flipped upwards to an unlocked position in order to release the locking mechanism 34, as shown in FIG. 8B. As shown, the spring-lock 34 includes a spring portion 35 wrapped around a rod 36 and a moveable handle 37 comprising an opening configured to fit over a top of the pin 14a. The moveable handle 37 can be manipulated to lock and unlock the locking mechanism 34, as shown in FIGS. 8A and 8B.

In a preferred embodiment, the locking mechanism 34 can be a self-locking mechanism that automatically moves into the locked position over the attachment mechanism 14 when the protective cover 20 is pressed onto the vehicle surface 12 and over the electrical module 10. For example, a downward force may be exerted on the movable handle 37 of the locking mechanism 34 by the spring 35. As the pins 14a are pushed up through the apertures 32 during installation of the cover 20, the moveable handle 37 may continue to be pressed downwards by the downward spring force, thus causing the handle 37 to automatically latch onto the pins 14a. The locking mechanism 34 can be unlocked by exerting an upward force on the handle 37 that exceeds the downward force of the spring 35.

The locking mechanism 34 can be coupled to each notch 30 using any suitable attachment technique, such as, for example, over molding techniques or a friction fit formed by pressing or pushing the locking mechanism 34 into a groove 38 formed in a back wall of the notch 30. In other embodiments, the locking mechanism may be an optional or removable lock that may be selectively added to the notches 34 at any time. In some embodiments, the locking mechanism may be a speed nut (also known as a "Tinnerman nut") or other type of locknut made of spring steel, an attachment clip, or other type of simple locking mechanism.

Referring now to FIGS. 1 and 9, in some cases, the electronic module 10 includes one or more connectors or connection tunnels 17 that extend out from a back side of the module 10 to electrically couple the connector(s) 17 to cables or wires (not shown) connected to other vehicle components (not shown). In such cases, the protective cover 20 can be configured so that a back sidewall 24d of the top portion 22 extends past the connectors 17 and includes an access port 40 to allow entry of the cables into the protective cover 20 for coupling to the connectors 17. For example, the access port 40 may include one or more openings formed in the back sidewall 24d. In one embodiment, the access port 40 includes a moveable member (not shown) (such as, e.g., a flap or cover) that covers the access port 40 when not in use and can be selectively opened or lifted to allow access to the connectors 17.

According to embodiments, the protective cover 20, and the components thereof, can be made using any suitable manufacturing process depending on the types of materials included in the cover 20. Example manufacturing processes include flow injection machines and casting.

It should be emphasized that the above-described embodiments, particularly, any "preferred" embodiments, are possible examples of implementations, merely set forth for a clear understanding of the principles of the invention. Many variations and modifications may be made to the above-described embodiment(s) without substantially departing from the spirit and principles of the techniques described herein. All such modifications are intended to be included herein within the scope of this disclosure and protected by the following claims.

The invention claimed is:

1. A protective cover for a control module mounted to a vehicle surface using attachment mechanisms that extend perpendicularly from the vehicle surface, the protective cover comprising:
a rigid top portion having a top surface and four sidewalls configured to cover the control module and engage the vehicle surface;
a plurality of insets molded into at least two of the sidewalls, each inset configured to receive a respective attachment mechanism; and
a flexible base portion comprising a compressible corrugated structure and coupled to a bottom edge of the top portion and configured to form a fluid-tight seal with the vehicle surface.

2. The protective cover of claim 1, wherein each inset includes three sidewalls terminating at a seat portion, the seat portion comprising an aperture for receiving the corresponding attachment mechanism.

3. The protective cover of claim 1, wherein at least two insets are molded into a first sidewall of the top portion and a third inset is molded into a second sidewall of the top portion.

4. The protective cover of claim 1, further comprising a plurality of locking mechanisms included in respective insets for removably securing the attachment mechanisms to the top portion.

5. The protective cover of claim 4, wherein each locking mechanism comprises a spring lock.

6. The protective cover of claim 1, wherein the top portion comprises a plurality of strengthening ribs coupled to an underside of the top surface.

7. The protective cover of claim 6, wherein the ribs are arranged to form a geometric pattern.

8. An apparatus for protecting a control module mounted to a vehicular surface using a plurality of attachment mechanisms, the apparatus comprising:
a rigid top structure configured to completely cover the control module; and
a flexible gasket comprising a corrugated structure which compresses and coupled to a bottom edge of the top structure and configured to removably engage the vehicular surface surrounding the control module in a fluid-tight seal.

9. The apparatus of claim 8, wherein the top structure is sized and shaped according to a size and shape of the control module.

10. The apparatus of claim 8, wherein the top structure has a height that is greater than a height of the control module.

11. The apparatus of claim 8, further comprising a plurality of insets formed within at least two sidewalls of the top structure for coupling the top structure to the attachment mechanisms included on the vehicular surface.

12. The apparatus of claim 11, wherein each inset includes an aperture for receiving a respective one of the attachment mechanisms.

13. The apparatus of claim 11, wherein an arrangement of the plurality of insets is based on a configuration of the attachment mechanisms on the vehicular surface.

14. The apparatus of claim 11, further comprising a plurality of locking mechanisms respectively included in the plurality of insets for securing the top structure to the attachment mechanisms.

15. The apparatus of claim 14, wherein the locking mechanisms include a releasable spring lock.

16. The apparatus of claim 8, wherein the top structure includes strengthening ribs arranged in a predetermined pattern on an underside of the top structure.

* * * * *